United States Patent [19]

Buck et al.

[11] 4,225,748
[45] Sep. 30, 1980

[54] SWITCHING DEVICE, ESPECIALLY FOR ELECTRONIC CONTACTLESS SWITCHES, E.G. PROXIMITY SWITCHES

[76] Inventors: Robert Buck, Kirchbühlweg 128, 7995 Neukirch; Gerd Marhofer, Beckmannsbusch 67, 4300 Essen-Bredeney, both of Fed. Rep. of Germany

[21] Appl. No.: 911,322

[22] Filed: Jun. 1, 1978

[30] Foreign Application Priority Data

Jun. 2, 1977 [DE] Fed. Rep. of Germany ....... 2724939

[51] Int. Cl.$^3$ .............................................. H05K 5/00
[52] U.S. Cl. .................................... 174/52 R; 328/5; 340/693; 361/179
[58] Field of Search ........................ 174/50, 52 R, 53; 328/5; 361/179, 180, 181; 307/116; 340/693

[56] References Cited

U.S. PATENT DOCUMENTS

| | | | |
|---|---|---|---|
| 2,410,287 | 10/1946 | Jaberg ..................................... | 174/53 |
| 3,197,658 | 7/1965 | Byrnes et al. ......................... | 307/116 |
| 3,716,651 | 2/1973 | Werner .................................. | 174/53 |
| 3,927,249 | 12/1975 | Pearse ................................. | 174/53 X |
| 4,090,091 | 5/1978 | Brown et al. ......................... | 328/5 X |

FOREIGN PATENT DOCUMENTS 7029767 11/1970 Fed. Rep. of Germany .
7440132 4/1975 Fed. Rep. of Germany .

Primary Examiner—Elliot A. Goldberg
Assistant Examiner—D. A. Tone
Attorney, Agent, or Firm—Karl F. Ross

[57] ABSTRACT

A switch assembly, especially for electronic contactless or proximity switches comprises a substantially two-part housing including the housing bottom and housing top which are separable from one another. The housing parts interfit to form a generally rectangular parallelepipedal structure provided at one end with a threaded connection for a threaded connector, pipe or conduit through which conductors may be passed to connect to the electronic device within the housing. The bottom housing portion is provided with the connecting circuitry while the top housing portion, interfitting with the bottom housing portion, has a part overhanging the latter and provided with the plug connectors forming a detachable electrical connection with the connecting circuitry permanently received in the lower housing portion. The upper housing portion contains all of the switch circuitry in its receptacle.

9 Claims, 6 Drawing Figures

SWITCHING DEVICE, ESPECIALLY FOR ELECTRONIC CONTACTLESS SWITCHES, E.G. PROXIMITY SWITCHES

CROSS REFERENCE TO RELATED APPLICATIONS

The present application is related to the commonly assigned copending applications Ser. Nos. 889,433 and 887,832 filed Mar. 23, 1978 and Mar. 17, 1978, respectively, and to the prior patents and publications mentioned therein.

FIELD OF THE INVENTION

The present invention relates to a switch device and, more particularly, to a contactless or proximity switch arrangement having a housing accommodating the switching circuitry.

BACKGROUND OF THE INVENTION

From the aforedescribed copending applications and other publications cited therein, it will be apparent that electronic, contactless switching devices have been provided heretofore and, generally, are known for a variety of applications.

It is also known to provide switching devices in a housing, generally a two-part housing, in which a cover is removably mounted upon a base which can be formed with a connection device electrically joined, in turn, to a cable which may pass through a pipe, duct or conduit threaded into the housing. The switching circuitry, in turn, can be provided in the receptacle formed by the base and can be electrically tied to the connecting or terminal device. The terminal device can, for example, be a terminal block and the switching circuitry can include at least one sensing element, for example, a sensing coil, a sensing electrode or a sensing opto-electronic system which can include a light generator and a light receiver.

Generally speaking, all of the circuit elements are provided in the receptacle formed by the bottom portion of the housing and are rendered accessible by removal of the cover.

Switching devices of the aforedescribed type are available in a variety of designs and for various purposes. For example, they may be proximity switches of the type described in the aforementioned copending application or, if required, contact switches which respond to the slightest of contact by the hand of the user or by some other element. Devices of the latter type are well known in elevator applications and the like.

The housing and fastening systems for such switches may correspond to various governmental standards, for example, the German industrial standard (DIN) 43 694.

In such a system, the bottom portion of the housing is generally block-shaped, i.e. has the configuration of a rectangular parallelepipedal box, and is provided with two receptacles. A first of these receptacles receives the terminal device, i.e. the portion of the electrical circuit provided with screw or other terminals, while the second receptacle encloses or receives the electronic switching circuit, or, more generally, the switching device. The upper portion of the housing forms a cover which seals the two receptacles of the bottom portion of the housing.

In this connection reference may be had to the German utility models (Gebrauchsmuster) 70 29 767 and 74 40 132.

Common to both these systems is an organization of the device whereby a replacement of the electrical circuit unit is possible although it is relatively expensive and complicated.

OBJECT OF THE INVENTION

It is the object of the present invention to provide an improved switching assembly which obviates disadvantages of earlier systems and is more readily and inexpensively fabricated, can be assembled and disassembled with greater ease than earlier systems, and facilitates use of the system.

SUMMARY OF THE INVENTION

This object and others which will become more readily apparent hereinafter are attained, in accordance with the present invention, in a system which, in its most general aspects, comprises a housing formed with a bottom portion and a top portion, i.e. a base and a cover, terminal means or a terminal device whereby an electric cable is provided with terminuses for connection to the switching circuitry, and the switching circuitry, both the switching circuitry and the terminal device being enclosed in the housing.

According to the present invention, the housing upper portion is formed with a receptacle for the electric circuit unit while the electric circuit unit is received within the receptacle of the upper portion of the housing.

The system of the present invention thus distinguishes from those of the prior art in that, whereas the switching circuit unit of the prior art is often disposed in a receptacle or housing formed by the bottom housing member, the corresponding electronic or electrical element, namely, the switching circuit or unit of the present invention, is wholly received in the receptacle formed by the upper housing portion.

According to an essential feature of the invention, the two housing portions interfit to form a generally rectangular parallelepipedal housing assembly.

As in the prior-art systems, however, the terminal device or unit with which the electrical switching circuit or unit can be detachably connected, is received wholly in a receptacle formed by the bottom portion of the housing.

According to an important feature of the invention, the assembly and the switching and terminal units thereof are so disposed and arranged that upon opening of the housing by separating the upper housing portion from the lower housing portion, results automatically in a detachment of the switching unit from the terminal unit.

This arrangement results in a considerable simplification of the replacement, removal, and detachment of the switching circuit, unit or device from the terminal unit. It is simply necessary to detach the upper housing portion and remove the same from the bottom portion whereupon the switching unit will be removed and detached with the upper housing portion.

The system whose principles have been described above, can be provided in various configurations and forms of which the best mode currently known to us will be described below.

According to the invention, therefore, the bottom portion of the housing may be formed in an elongated design with the upwardly open receptacle accommodating the terminal device being disposed at one end or side of this housing portion while the other side or end of the housing portion is formed with a plate which covers and registers with the downwardly open receptacle of the upper housing portion when the latter is applied to the lower housing portion. In addition, the upper housing portion can have a projecting part or overhanging part which covers the upwardly open receptacle of the lower housing portion and thereby encloses the terminal device received therein. This overhanging portion of the upper housing member can be provided with plug, jack or socket means cooperating with complementary means of the terminal device to affect automatic electrical connection of the circuit unit with the terminal device when the upper housing portion is assembled onto the lower housing portion.

More specifically, in the system of the present invention, the lower portion or member of the housing is provided with a cover plate for the receptacle of the lower housing portion. Consequently, the lower housing portion in part underlies the receptacle of the upper housing portion while the upper housing portion has a projection which overhangs the receptacle of the lower housing portion.

In this construction of the device of the present invention both housing portions effectively consist of main parts and auxiliary parts. The main part in each case is constituted as a receptacle for the respective device while the auxiliary part constitutes a closure for the receptacle of the main part of the other device of the other housing portion.

In the best mode embodiment of the present invention, the terminal device, which is received wholly in the receptacle of the lower housing member, is provided with at least two sockets adapted to establish electrical connection with plugs carried by the overhanging portion of the upper housing member and which plugs are in turn electrically connected to the switching circuit unit received in the receptacle of the upper housing member.

Alternatively, the sockets can be provided in the overhanging portion of the upper housing member and the terminal device can be formed with plugs engageable in these sockets. With this device, therefore, the opening of the housing results both in mechanical separation of the upper housing member from the lower housing member and a correspondingly direct separation of the two electrical elements, namely, the switching circuit unit in the receptacle of the upper housing member and the terminal unit in the receptacle of the lower housing unit.

While the plugs or pins and the sockets receiving same may be formed in either of the two housing members to engage the correspondingly positioned connecting elements of the other, it has been found to be most advantageous, from the point of view of avoiding contact between voltage carrying elements of the lower-housing portion which may remain connected to the cable and the upper housing portion when the latter is being removed or applied to the lower housing portion or in the open condition of the device, to form the sockets on the terminal unit and the pins on the removable upper member of the housing.

According to yet another feature of the invention, also part of the best mode for carrying out the same in practice, the circuit unit (switch unit) and the receptacle receiving same are substantially cubical in configuration.

This configuration affords the possibility of providing the sensing element (proximity sensor) on five different sides of the cubical housing formed by the receptacle or the cubic configuration of the switching unit itself.

According to still another feature of the invention, the bottom member of the housing is formed in the region of its center with preferably two guide bodies while the upper portion of the housing is provided with two complementary guide projections which insure proper emplacement of the upper housing portion upon the lower housing portion.

The guide means can include an inclined surface on each of the lateral flanks of the receptacle of the terminal unit which can cooperate with inclined flanks of the cover portion of the upper housing member to form the guide means at least in part.

At one end of the lower housing portion, there can be provided an opening having an internal thread which can be a pipe thread enabling the housing to be mounted upon a threaded nipple, a threaded conduit or a threaded pipe. Such a screw thread may be of the Pg type.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
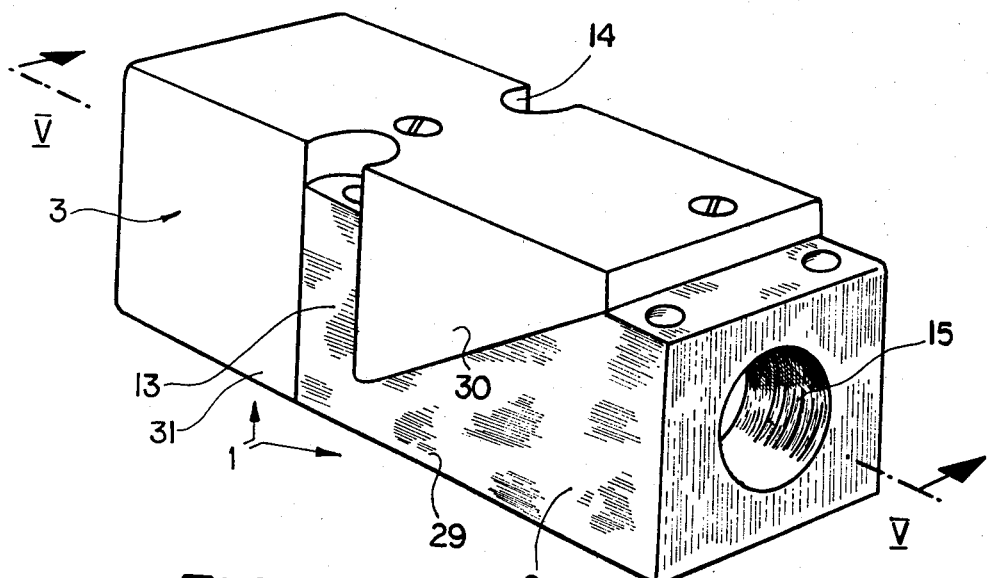
FIG. 1 is a perspective view of a preferred embodiment of the switching assembly of the present invention.
Figure 2:
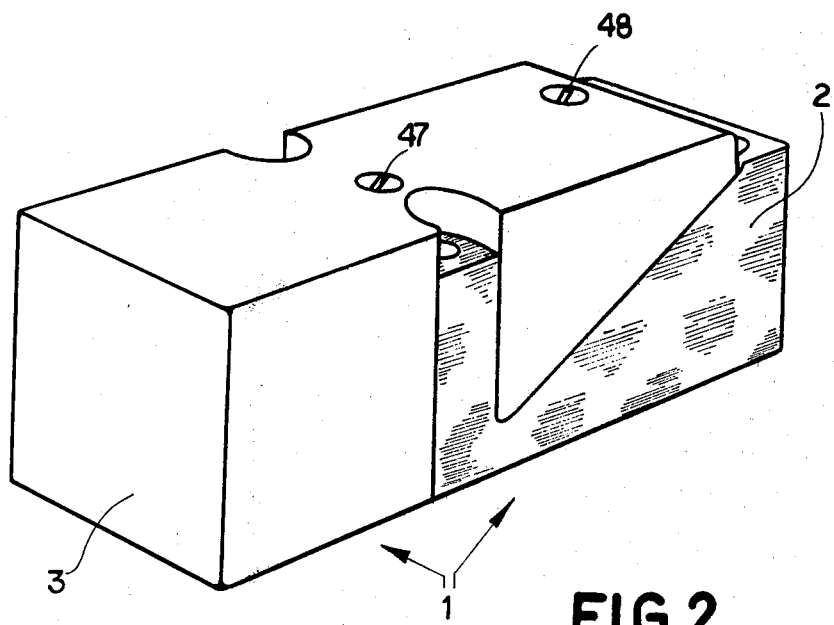
FIG. 2 is a top perspective view of the assembly as seen from the other end thereof.

The drawing shows a switching device and, more particularly, an electronic contactless switching device which essentially comprises a housing 1 provided with a housing bottom member 2 and a housing upper member 3. A terminal unit 4 is connected to a cable (not shown) and can be electrically connected, in turn, to the switching unit 5 which is formed with at least one sensor 6. The sensor 6 can be a proximity sensor of the type described in the aforementioned copending applications and the circuit can have the configuration of that of the aforementioned copending applications and patents mentioned therein.

More generally, the sensor 6 can be a sensing coil responding to inductivity changes, a sensing electrode responding to capacitive changes or static electrical phenomena, or an optoelectronic sensor which can include a light generator and a light receiver.

The bottom member 2 of the housing is formed with an upwardly open generally cubical receptacle 7 for the terminal unit 4. The terminal unit 4 is thus disposed entirely within the receptacle 7 of the bottom housing member 2. The electrical circuit unit 5 is detachably connected with the terminal unit 4 as will be described below.

According to the invention, the upper housing member 3 is formed with a downwardly open cubical receptacle 8 which encloses the circuit unit 5 so that the electric circuit unit 5 is wholly received in the receptacle 8 of the upper member 3 of the housing.

The lower member 2 of the housing is provided with a projecting portion forming a cover plate 9 which is received within the upper housing portion to cover the receptacle 8 while the upper housing member 3 is provided with a partly overhanging cover cap 10 which encloses the upper end of the receptacle 4 and covers the latter.

Figure 5:
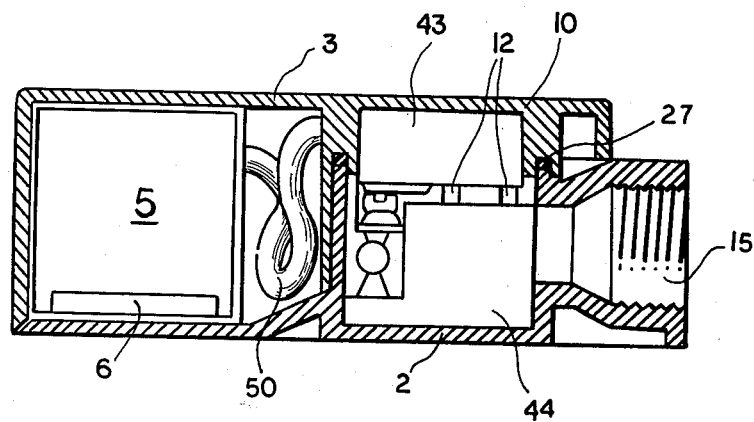
FIG. 5 is a cross-sectional view in somewhat diagrammatic form, taken along the line V—V of FIG. 1.
Figure 6:
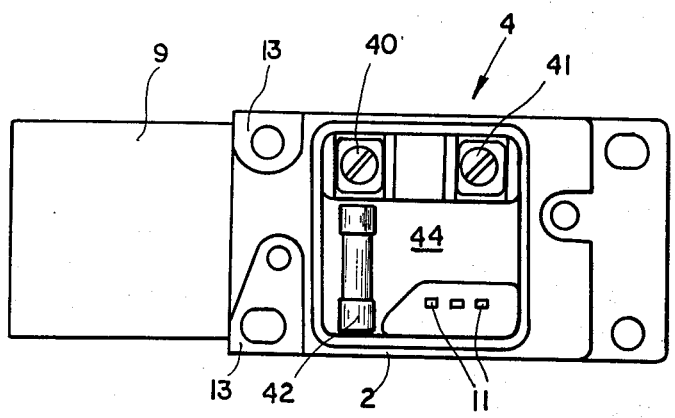
FIG. 6 is a plan view of the bottom member of the housing.

As is especially evident from FIGS. 5 and 6, a preferred embodiment of the present invention provides the terminal unit 4 with at least two and preferably three sockets 11 which form the electrical connection to the circuit 5. The switching unit 5 can be provided with connecting pins or plugs 12 which engage in the sockets 11 to make the necessary electrical connection when the cover member is applied to the bottom unit 2.

Figure 3:
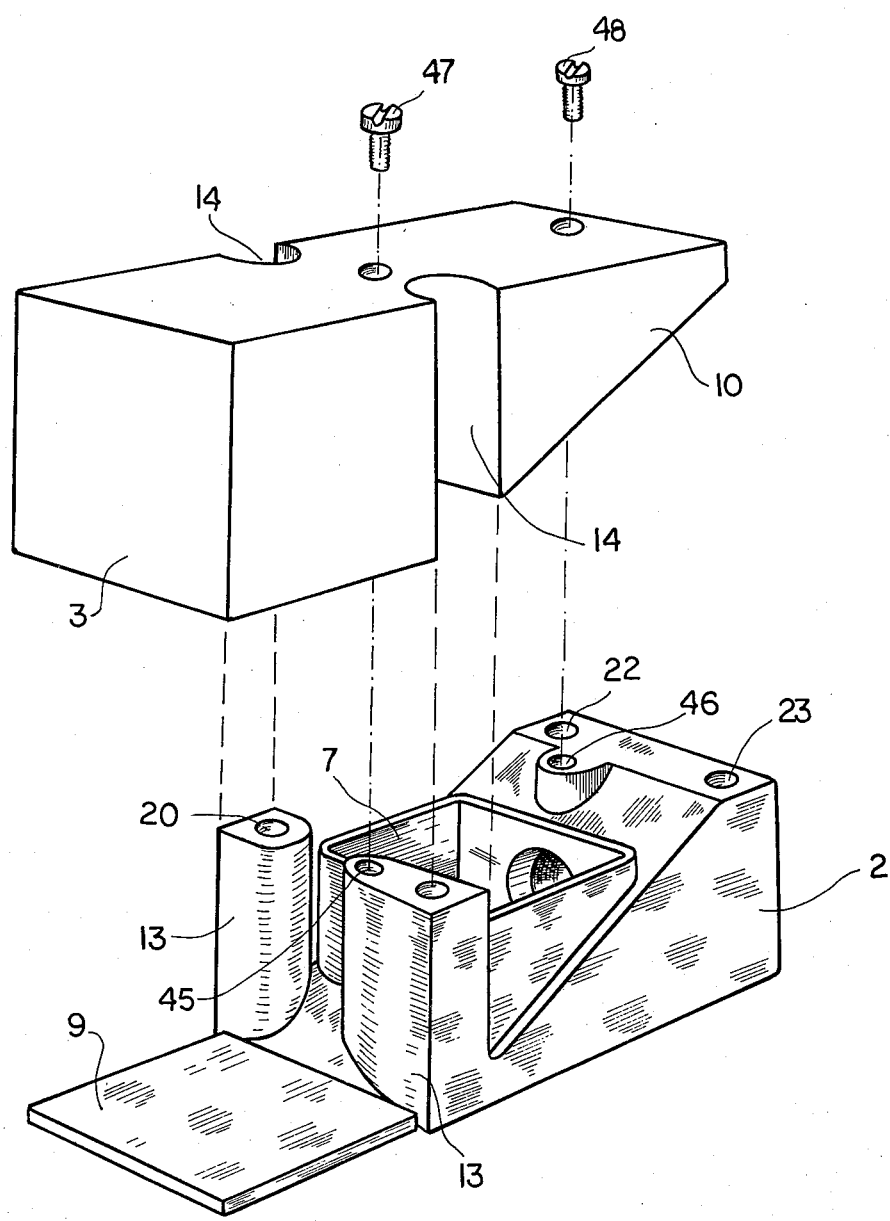
FIG. 3 is an exploded view of the assembly of FIGS. 1 and 2, the terminal unit being removed to show the receptacle therefor.
Figure 4:
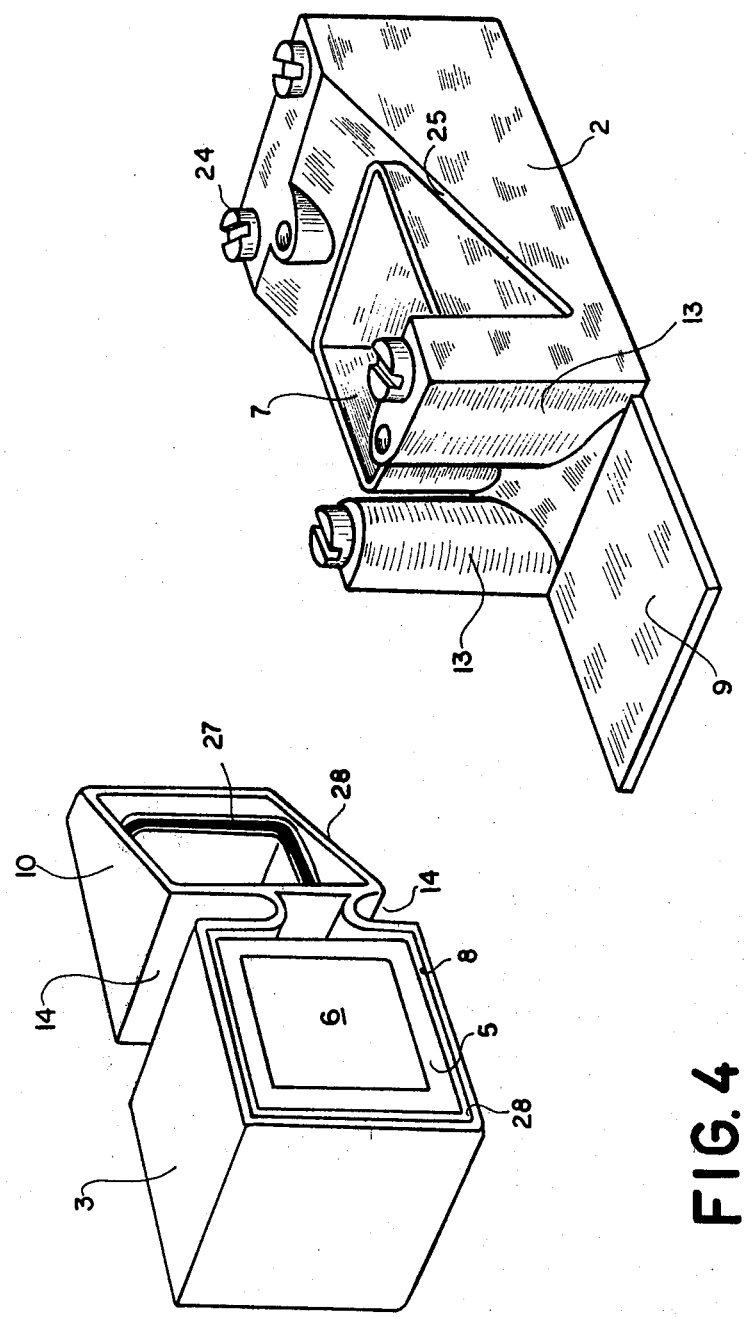
FIG. 4 is another exploded view in which the cover member has been turned over and the screws which mount the base unit to a surface are shown in place.

FIGS. 3 and 4 show a pair of upstanding guide bodies or posts 13 which are slidably received in recesses 14 formed in the upper housing member 3, thereby enabling the upper housing member to be applied in proper orientation without manipulation.

The lower housing member 2 is, moreover, provided with an internal thread 15 for a Pg threaded connection, e.g. for connection of a conduit through which the cable passes. A convention cable connection may also be provided in lieu of a conduit connection by the thread 15.

From FIG. 1 it will also be apparent that the flanks 30 of the cap 10 lie flush with the lateral flanks 29 of the bottom member 2 while the outer surfaces 31 of the receptacle portion of the upper member 3 are likewise flush with the surfaces 29. Screws 47 and 48 pass through bores in the upper member 3 and engage in threaded bores 45 and 46 formed on the lower housing member 2.

The lower housing member 2 is also formed with throughgoing bores 20, 21, 22 and 23 through which screws 24 can pass to secure the lower housing member to a base or other surface.

The cap 10 also is provided with a groove in which a sealing ring 27 is received to engage the rim of the upper upwardly open receptacle 7, thereby sealing the latter against access of moisture. The downwardly open receptacle 8 may also be provided with a groove 28 accommodating another elastomeric seal which can bear against the plate 9 for hermetic sealing purposes.

In addition, the cap 10 is provided with a pair of inclined ramps 26 which are complementary to and engage the inclined surfaces 25 flanking the receptacle 7 which is formed by a rectangular shell, to insure a labyrinth-type sealing arrangement of the receptacle accommodating the terminal unit.

The sockets 11 are formed unitarily in the terminal block 44 which can be provided with terminal screws 40 and 41 to which the cable can be connected in accordance with conventional conductor terminal connection practices. The pins or plugs 12 can be molded into a further block 43 accommodated in the cap 10 and best seen in FIG. 5. From FIG. 6 it will also be apparent that the terminal unit can include a fuse 42. The electrical conductor 50 shown in FIG. 5 connects the switch unit 5 with the block 43 and the pins 12.

We claim:

1. A switch assembly comprising:
  a housing having a lower housing member and an upper housing member interfitting to form a generally rectangular parallelepipedal configuration, said lower housing member being formed with a lower receptacle and said upper housing member being formed with an upper receptacle;
  a terminal unit connectable to a cable and received in said lower receptacle;
  an electric switch unit received in said upper receptacle and connectable to said terminal unit; and
  means for securing said members together, said upper member being removable from said lower member, thereby detaching said switch unit therefrom, said lower member being formed with a cover plate projecting from said lower receptable and covering said upper receptacle when said members are interconnected.

2. The assembly defined in claim 1 wherein said upper member is formed with a cover cap overhanging said lower receptacle and closing same when said members are interconnected.

3. The assembly defined in claim 1 wherein said terminal unit includes at least two electrical connectors and said upper member is formed with at least two electrical connectors engaging the connectors of said terminal unit when said members are fitted together.

4. The assembly defined in claim 3 wherein the electrical connectors of said terminal unit are sockets and the connectors of said upper member are pins engaging in said sockets.

5. The assembly defined in claim 1 wherein said upper receptacle is of generally cubic configuration.

6. The assembly defined in claim 1 wherein said lower member is provided in the region of its center with a pair of upstanding guides and said upper member is formed with recesses slidably engaging and receiving said guides.

7. The assembly defined in claim 1 wherein said lower member is formed with a bore provided with an internal thread for connection of the cable to said lower member.

8. A switch assembly comprising:
  a housing having a lower housing member and an upper housing member interfitting to form a generally rectangular parallelepipedal configuration, said lower housing member being formed with a lower receptacle and said upper housing member being formed with an upper receptacle;
  a terminal unit connectable to a cable and received in said lower receptacle;
  an electric switch unit received in said upper receptacle and connectable to said terminal unit; and
  means for securing said members together, said upper member being removable from said lower member, thereby detaching said switch unit therefrom, said lower member being formed with a bore provided with an internal thread for connection of the cable to said lower member, said lower member being elongated and is formed with said lower receptacle adjacent one end and said threaded bore communicates with said lower receptacle at said one end, the other end of said lower member being provided with a cover plate projecting from said receptacle, a pair of upstanding guide posts being provided substantially at the junction between said cover plate and said lower receptacle, said cover plate being received in said upper member and covering said upper receptacle, said upper member being elongated and being provided with said upper receptacle at one end and with a cap overlying and receiving said lower receptacle at its other end, said upper member being formed with a pair of recesses receiving said posts between said cap and said upper receptacle.

9. The assembly defined in claim 8 wherein said cap is provided with a block formed with a pair of connecting pins, said terminal unit being formed with a pair of sockets receiving said pins, said pins being withdrawable from said sockets upon separation of said members, said cap having a pair of ramps flanking said lower receptacle and said lower member having a pair of inclined surfaces flanking said lower receptacle and complementary to said ramps, the lateral surfaces of said upper and lower members being flush with one another upon interfitting of said members, said lower members being formed with throughgoing bores enabling screws to be passed therethrough to mount said lower member upon a surface, said switch unit being a contactless switching device having a sensing element responsive to proximity.

* * * * *